United States Patent
Krischke et al.

(10) Patent No.: US 8,120,135 B2
(45) Date of Patent: Feb. 21, 2012

(54) TRANSISTOR

(75) Inventors: Norbert Krischke, Munich (DE);
Nicola Vannucci, Fuernitz (AT); Sven Lanzerstorfer, Feldkirchen (AT);
Thomas Ostermann, Oberwinklern (AT); Mathias Racki,
Hilgertshausen-Tandern (DE); Markus Zundel, Egmating (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/704,034

(22) Filed: Feb. 11, 2010

(65) Prior Publication Data
US 2010/0207206 A1 Aug. 19, 2010

Related U.S. Application Data

(63) Continuation-in-part of application No. 11/132,561, filed on May 19, 2005, now abandoned.

(30) Foreign Application Priority Data

May 19, 2004 (DE) .......................... 10 2004 024 887

(51) Int. Cl.
*H01L 29/76* (2006.01)
(52) U.S. Cl. .. 257/467; 257/469; 257/470; 257/E29.262
(58) Field of Classification Search .................. 257/467, 257/469, 470, E29.262
See application file for complete search history.

(56) References Cited

U.S. PATENT DOCUMENTS

| 5,828,263 | A | 10/1998 | Gantioler et al. |
| 6,144,085 | A | 11/2000 | Barker |
| 6,198,127 | B1 | 3/2001 | Kocon |
| 6,359,308 | B1 | 3/2002 | Hijzen et al. |
| 7,129,557 | B2 * | 10/2006 | Berndlmaier et al. ........ 257/470 |
| 7,345,342 | B2 | 3/2008 | Challa et al. |
| 2003/0082842 | A1 | 5/2003 | Hwu et al. |
| 2004/0089910 | A1 | 5/2004 | Hirler et al. |

FOREIGN PATENT DOCUMENTS

| DE | 19534604 | 10/1996 |
| JP | 10214968 | 8/1998 |
| JP | 2002229618 | 8/2002 |

* cited by examiner

*Primary Examiner* — Eugene Lee
(74) *Attorney, Agent, or Firm* — Dicke, Billig & Czaja, PLLC

(57) ABSTRACT

A transistor has a cell array with two or more transistor cells, a temperature sensor, which is integrated in the cell array or is adjacent to the cell array, and an isolation structure. The isolation structure isolates the temperature sensor from the cell array, and has an isolation trench, which is arranged between the cell array and the temperature sensor. The distance between the temperature sensor and the active transistor cell that is closest to the temperature sensor corresponds approximately to the pitch between active transistor cells within the cell array.

23 Claims, 16 Drawing Sheets

TRANSISTOR

CROSS-REFERENCE TO RELATED APPLICATIONS

This application is a Continuation-in-Part of U.S. patent application Ser. No. 11/132,561, entitled "TRANSISTOR," having a filing date of May 19, 2005, and claims priority to German Patent Application No. DE 10 2004 024 887.7, filed on May 19, 2004, all of which are incorporated herein by reference.

BACKGROUND

The invention relates to a transistor, in particular to a trench transistor.

Power transistors have to process high current levels, which frequently leads to severe heating of the transistor. In order to prevent overheating of the transistor, temperature sensors are frequently integrated in transistors such as these. The temperature sensors may, for example, be integrated in a cell array in the transistor, or else may be formed in the immediate vicinity of the cell array, with the temperature sensor being electrically isolated from the cell array by an isolation structure. The isolation structure in general comprises an edge termination for the cell array as well as an edge termination for the temperature sensor. Since both edge terminations are arranged immediately adjacent to one another, the distance between the temperature sensor and the transistor cells in the cell array is relatively large. The resultant temperature gradient between the temperature sensor and the transistor cells leads to corruption of the temperature measurement. Another disadvantage is that the temperature sensor records the temperature in the cell array with a considerable time delay.

The problems mentioned above will be explained in more detail in the following text with reference to FIG. 7.

FIG. 7 illustrates a detail of a trench transistor 1 (DMOS transistor) in which an edge area 2 of a cell array as well as a temperature sensor 3 can be seen. The cell array has two or more active transistor cells 4, with an inactive edge cell 5 as well as an edge termination 6 being adjacent to the active transistor cells 4. The active transistor cells 4 have an n$^+$-doped source region 7, a p$^+$-doped body region 8, as well as an n-doped drift region 9. Each active transistor cell 4 is also bounded by trenches 10, with at least one electrode 11 being provided in each of the trenches and being electrically isolated by an isolation layer 12 from the semiconductor region which is adjacent to the trench 10. The electrode 11 is used as a gate, in order to induce a channel from the source region 7 into the drift region 9 through the body region 8. Isolation layers 13 are provided above the trenches 10. A source metallization layer 14 terminates the cell array at the top. There is no source region in the inactive edge cell 5. The edge termination 6 essentially comprises a trench 15 in which an electrode 16 is embedded, which projects upwards out of the trench 15. Furthermore, an n$^+$-doped region 17 is provided, in order to suppress parasitic currents between the edge area 2 and the temperature sensor 3.

The temperature sensor 3 has a p-doped base region 18, which is in the form of a well region, as well as a base connection 19 and an emitter connection 20. A p$^+$-doped region 21 is provided between the base region 18 and the base connection 19, and an n$^+$-doped region 22 is provided between the emitter connection 20 and the base region 18. The field electrode, which is identified with the reference symbol 23, is optional and is part of the edge termination of the temperature sensor 3. The layers which are identified by reference symbols 24 and 25 represent isolation layers. FIG. 7 illustrates the equivalent circuit of the temperature sensor 3 (a transistor whose switched-off current is a measure of the temperature at the temperature sensor 3).

The lateral extent of the edge area 2, in particular the extents of the inactive edge cell 5 and of the edge termination 6, has an effect that is not negligible on the temperature measured by the temperature sensor 3. The active cells of the trench transistor 1 (that is to say the "heat sources") are separated by about 40 to 100 μm from the temperature-sensitive area of the temperature sensor 3; the distance D1, which is illustrated in FIG. 7, is about six times the pitch between the active cells 4 of the cell array.

A trench transistor whose cell array temperature can be measured with as little corruption as possible would be a useful improvement.

If two or more mutually independent semiconductor functional elements, for example NMOS and/or PMOS transistors, are intended to be arranged alongside one another, then it is necessary to isolate the semiconductor functional elements from one another electrically (self-isolation) in order to avoid disturbing influences between the semiconductor functional elements. Known isolation structures for self-isolation of an NMOS transistor and of a PMOS transistor will be explained in more detail in the following text with reference to FIG. 14.

The upper part of FIG. 14 illustrates a (schematically simplified) edge termination of an NMOS transistor. A retrograde-doped p well 31 as well as a homogenously doped p well 32 are provided in a substrate 30. A first and a second isolation layer 33, 34 are arranged on the substrate 30, between which a p$^+$-doped region 35 is formed. The p$^+$-doped region 35 is electrically connected to a field plate 36, which is arranged on the second isolation layer 34. Furthermore, a gate 37 is provided above a part of the retrograde-doped p well 31.

The lower part of FIG. 14 illustrates a (schematically simplified) edge area of a PMOS transistor. A retrograde-doped p well 41, a homogenously doped p well 42, a homogenously doped n well 43 and an isolation well 44 are formed in a substrate 40. A first and a second isolation layer 45, 46 are formed on the substrate 40, between which a p$^+$-doped region 47 is provided. The p$^+$-doped region 47 is electrically connected to a field plate 48 which is provided on the second isolation layer 46. A gate 49 is provided above a part of the n well 43.

The edge structures that are illustrated in FIG. 14 require a large amount of space in order to provide a desired withstand voltage, and to prevent an electrical field from punching through (the punch effect) into undesirable regions, and the formation of parasitic channels, in particular of PMOS channels between two adjacent wells.

A transistor component that has two or more functional elements that are arranged alongside one another and can still be adequately isolated from one another even with an increased integration density would be a useful improvement.

For these and other reasons there is a need for the present invention.

SUMMARY

The transistor according to one embodiment of the invention has a cell array with two or more transistor cells, a temperature sensor which is integrated in the cell array or is adjacent to the cell array, and an isolation structure which electrically isolates the temperature sensor from the cell array. The isolation structure has an isolation trench, which is arranged between the cell array and the temperature sensor. The distance between the temperature sensor and the active transistor cell that is closest to the temperature sensor is chosen such that it corresponds approximately to the pitch between active transistor cells within the cell array.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
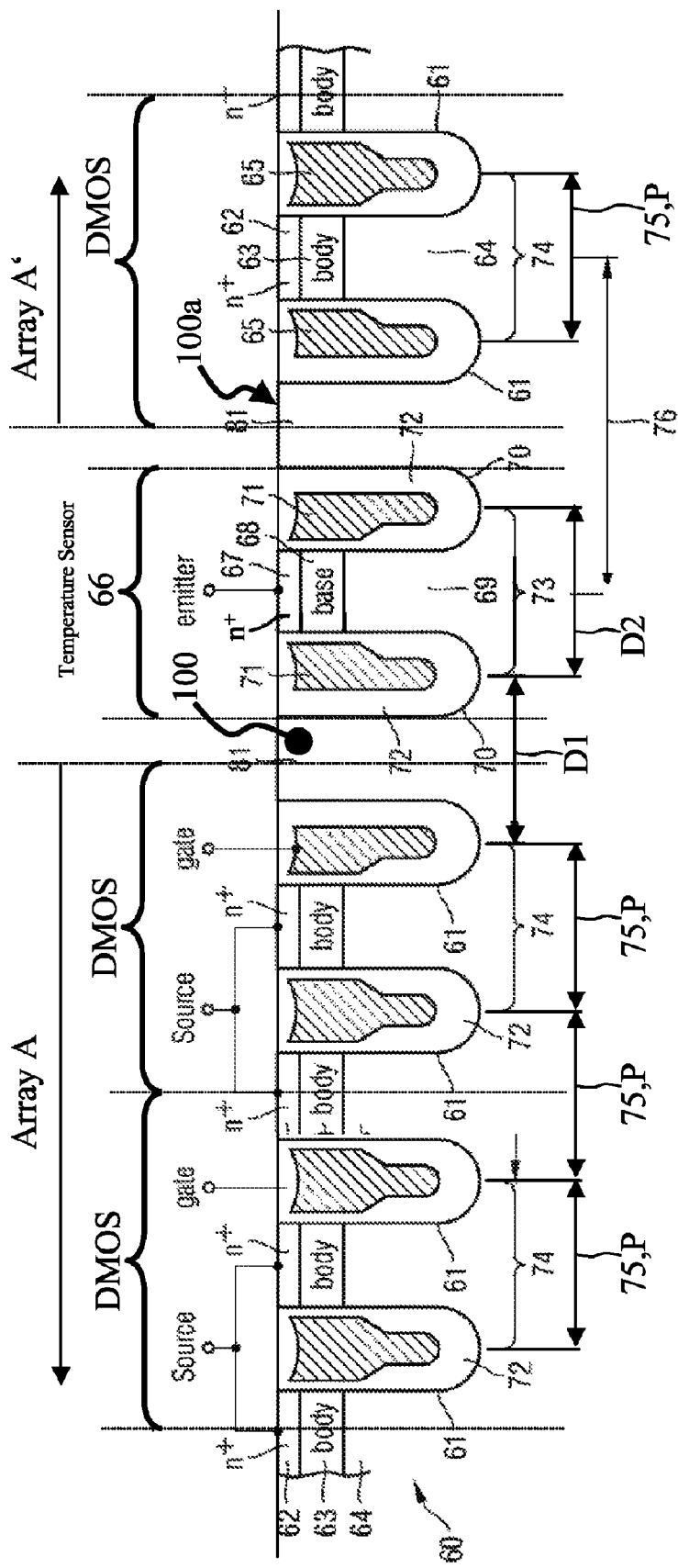
FIG. 1 illustrates one embodiment of a transistor according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment of the invention provides an isolation structure, which is essentially based on the use of isolation trenches, that ensures adequate isolation between the temperature sensor and the cell array. The lateral extent of the isolation structure can accordingly be reduced to the lateral extent which is provided by the isolation trench itself Experiments have shown that a distance between the temperature sensor and the active transistor cell which is closest to the temperature sensor of one pitch (the width of an active cell, that is to say the width of a cell array trench and of a mesa region arranged between two cell array trenches) is adequate.

In some embodiments, the internal walls of a cell array trench that is closest to the isolation trench, as well as the internal walls of the isolation trench, are clad with isolation layers. Provided in some cases, is at least one electrode (gate electrode or field plate) within the isolation trench and within the cell array trench that is closest to the isolation trench, which electrode is electrically isolated by the isolation layers from the semiconductor region which is adjacent to the trenches.

In order to ensure adequate electrical isolation, at least two isolation layers which follow one another in the horizontal direction and are formed within the isolation trench or the closest cell array trench should be thickened over the entire vertical extent of the trench. Thus, for example, the two successive, thickened isolation layers can both be formed within the isolation trench. Alternatively, one of the thickened isolation layers can in each case be formed within the isolation trench and the closest cell array trench. The thickened isolation layers ensure potential and field strengths that preclude or adequately ameliorate any influence on the method of operation of the transistor cells in the cell array by the temperature sensor.

A mesa region, which is located between the isolation trench and the closest cell array trench may be activated or deactivated depending on which potentials and/or electrical fields are intended to be produced within the isolation structure; the mesa region may have active/inactive cells.

In some embodiments, the transistor cells are in the form of DMOS (double diffusion MOS) transistor cells, although the invention is not restricted to them. By way of example, the transistor cells may also be in the form of MOS or bipolar elements.

In some embodiments, the temperature sensor is in the form of a transistor, but may also be in the form of a diode or a resistor. If the temperature sensor is in the form of a transistor then, for example, its switched-off current can be used as a measure of the prevailing temperature.

In one embodiment, one or more electrodes (which are isolated from one another) is or are provided in the isolation trench. The potentials of the electrodes that are isolated from one another may differ so that varying potentials occur in the lateral and/or in the vertical direction in the isolation trenches, depending on whether the mutually isolated electrodes are arranged one above the other and/or alongside one another. Potential values are, for example, the source potential, the gate potential or the (drain potential/2) or the (substrate potential/2), that is, those potentials that are available in the transistor in any case.

If the temperature sensor is enclosed by two isolation trenches, for example, when the temperature sensor is adjacent to cell arrays on both sides, then the distance between the two isolation trenches may be the same, or else may be less than or greater than the pitch between active transistor cells within the cell array. The potential line profile on the temperature sensor can be set deliberately by suitable choice of this distance.

In one embodiment, the transistor is in the form of a trench transistor, but can also be provided in some other way.

Accordingly, the lateral extent of the isolation structure is shortened according to one embodiment of the invention, thus resulting in only a very shallow temperature gradient being formed between the transistor cells in the cell array and the temperature sensor, thus allowing more accurate temperature measurement. Furthermore, this short distance means that there is only a very short time delay between a temperature change within the cell array and its detection. The sensitivity of the temperature sensor is thus significantly increased. The area which has been gained by reducing the size of the isolation structure may be used, for example, to enlarge the cell array and thus to increase the performance of the transistor.

One embodiment of the invention also provides a transistor component that has a semiconductor body in and/or on which two or more transistors (functional elements), which are arranged alongside one another, are formed. The transistors are electrically isolated from one another by means of isolation structures, with each isolation structure having an isolation trench.

The isolation trench ensures adequate isolation between the transistors which are located alongside one another. For this purpose, the isolation trench is made sufficiently deep (for example, deeper than the penetration depths to isolating doped well regions in the substrate).

The isolation trenches in one embodiment form the edge terminations of doped well regions that are formed in edge areas of the transistors. This means that the well regions are each directly adjacent to an isolation trench. Alternatively, the isolation trenches may be at a distance from the doped well regions, that is, the isolation trenches can be provided at a distance from the doped well regions, between doped well regions which are in each case formed in edge areas of the transistors.

In one embodiment, the transistors are in the form of an n-channel MOS or p-channel MOS transistor. However, the invention is not restricted to this. One electrode is provided in each case within the isolation trenches, and the potential on this electrode is the substrate potential (Vbb). This makes it possible to suppress parasitic channels (for example PMOS channels) between adjacent well regions which are each associated with different transistors. Since the potential of the well regions may be undefined, the electrode in the isolation trench should be surrounded by thickened isolation layers in order to prevent oxide punch-through.

In one case, the transistor component is in the form of a trench transistor. In one case, the isolation trench is produced together with the cell array trench, in one process step. This keeps the production effort for the isolation structure low, since the cell array trenches have to be produced in any case, and the shape and dimensions of the isolation trench are normally identical or similar to those of the cell trench.

According to one embodiment of the invention, outward diffusion areas of the well regions as well as space charge zones that are formed can be bounded by the isolation trench. Furthermore, the lateral extent of the transistor component can be reduced.

FIG. 1 illustrates a cross-section of a trench transistor according to one embodiment of the invention. Two or more cell array trenches 61 are provided in a substrate 60, with source regions 62, body regions 63 and drift regions 64 being provided in the semiconductor regions (mesa regions) located between the cell array trenches 61. Electrodes 65, which are used as gate electrodes and/or as field plates, are provided in the cell array trenches 61. A temperature sensor 66, which in this embodiment is in the form of a bipolar transistor, is formed within the cell array which is formed by the cell array trenches 61 and the mesa regions located between them. The bipolar transistor is in the form of a source region 67, a body region 68 and a drift region 69 within a mesa region which is bounded by two isolation trenches 70. Electrodes 71 which act as field plates are provided within the isolation trenches, and are each electrically isolated by means of an isolation layer 72 from the semiconductor region which is adjacent to the trenches, in the same way as the electrodes within the cell array trenches. The temperature sensor 66 may also be provided in some other way, for example in the form of a diode or the like.

As can be seen from FIG. 1, a temperature-sensitive area 73 of the temperature sensor 66 is separated from a first active cell 74 in the cell array just by one pitch 75. This allows a largely uncorrupted temperature measurement. The trench transistor which is illustrated in FIG. 1 is in the form of a DMOS transistor. However, the invention is not restricted to this, but can also make use of a large number of widely different types of transistors.

As further illustrated in FIG. 1, the cell array A is formed by a plurality of active transistor cells 74. Each transistor cell 74 includes a pair of transistor trenches 61. The pairs of transistor trenches 61, and therefore the transistor cells 74 of next neighbor transistor cells 74, are separated by a distance P which is called a pitch 75 underlying the array A.

Proximate to the array A the temperature sensor 66 is formed. In the embodiment of FIG. 1, the temperature sensor 66 is located between the array A on the left hand side and another array A' on the right hand side. The temperature sensor 66 includes an isolation structure, which is formed by a pair of isolation trenches 70 that are inter alia filled with an isolation layer 72.

When taken the geometrical centers of the isolation trenches 70 in the usual manner than a distance D2 between next neighbor isolation trenches 70 can be defined. In a comparable manner, when taking the centers of the isolation trenches 70 of the temperature sensor 66 on the one hand and the centers of the transistor trenches 61 of the transistor cells 74 of the arrays A and A' on the other hand a distance D1 between the temperature sensor 66 and the next transistor cell 74 can be defined.

In the embodiment of FIG. 1 the distance D1 between the temperature sensor 66 and the closest active transistor cell 74 has approximately the value of the pitch 75 underlying the array A of transistor cells 74.

In addition in the embodiment of FIG. 1 the distance D2 between the isolation trenches 70 of the temperature sensor 66 is comparable to the pitch 75 underlying the array A of transistor cells 74.

Figure 15:
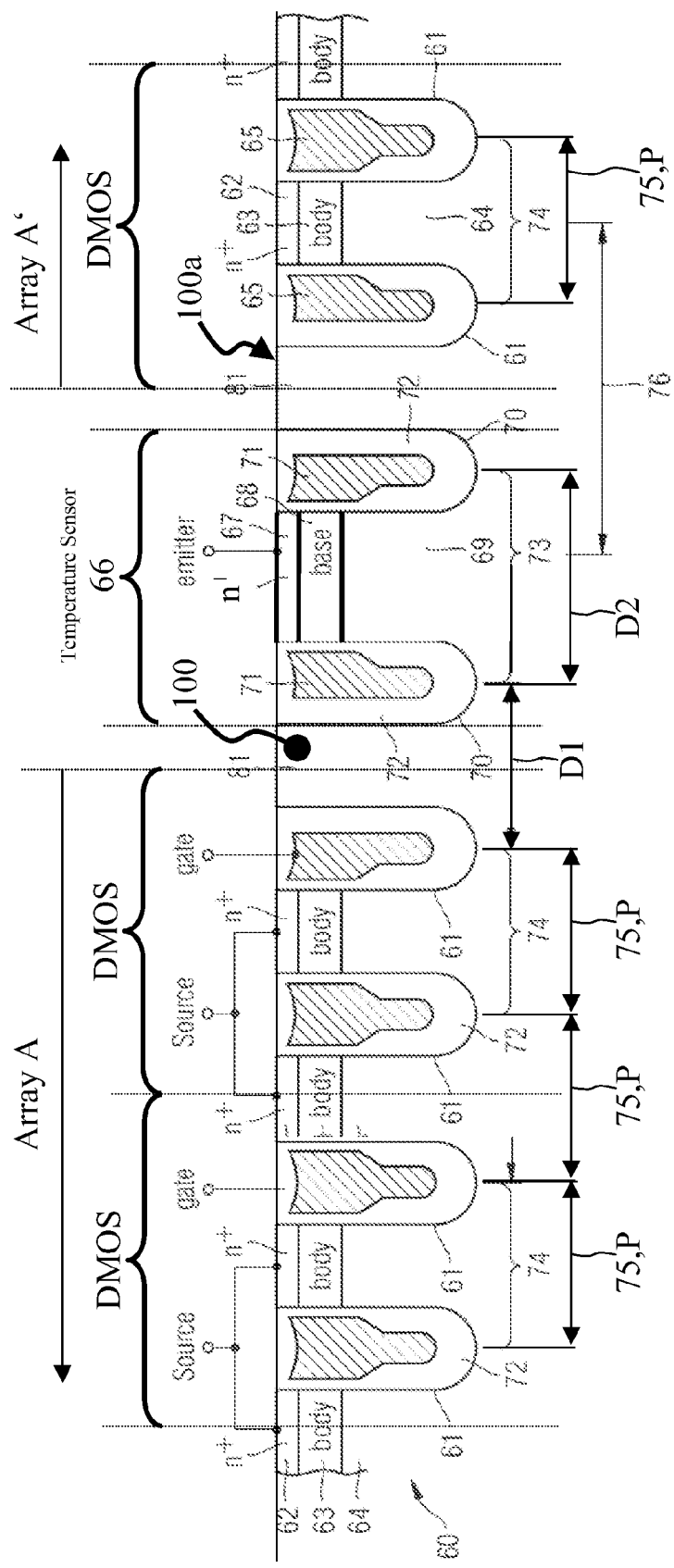
FIG. 15 illustrates a further embodiment of a transistor device according to the present invention.

In contrast thereto the embodiment of FIG. 15 illustrates a situation—although being highly comparable to the situation of FIG. 1—in which the distance D2 between the isolation trenches 70 of the underlying temperature sensor 66 is larger or greater than the pitch 75 of the underlying array A of transistor cells 74.

In the embodiments of FIGS. 1 and 15 the temperature sensor 66 is proximate to the cell array A. In fact, in the embodiment as illustrated in FIG. 1 the temperature sensor is situated between two transistor arrays A, A'. It is also possible to have the temperature sensor 66 proximate to only one array A of transistor cells 74.

Figure 16:
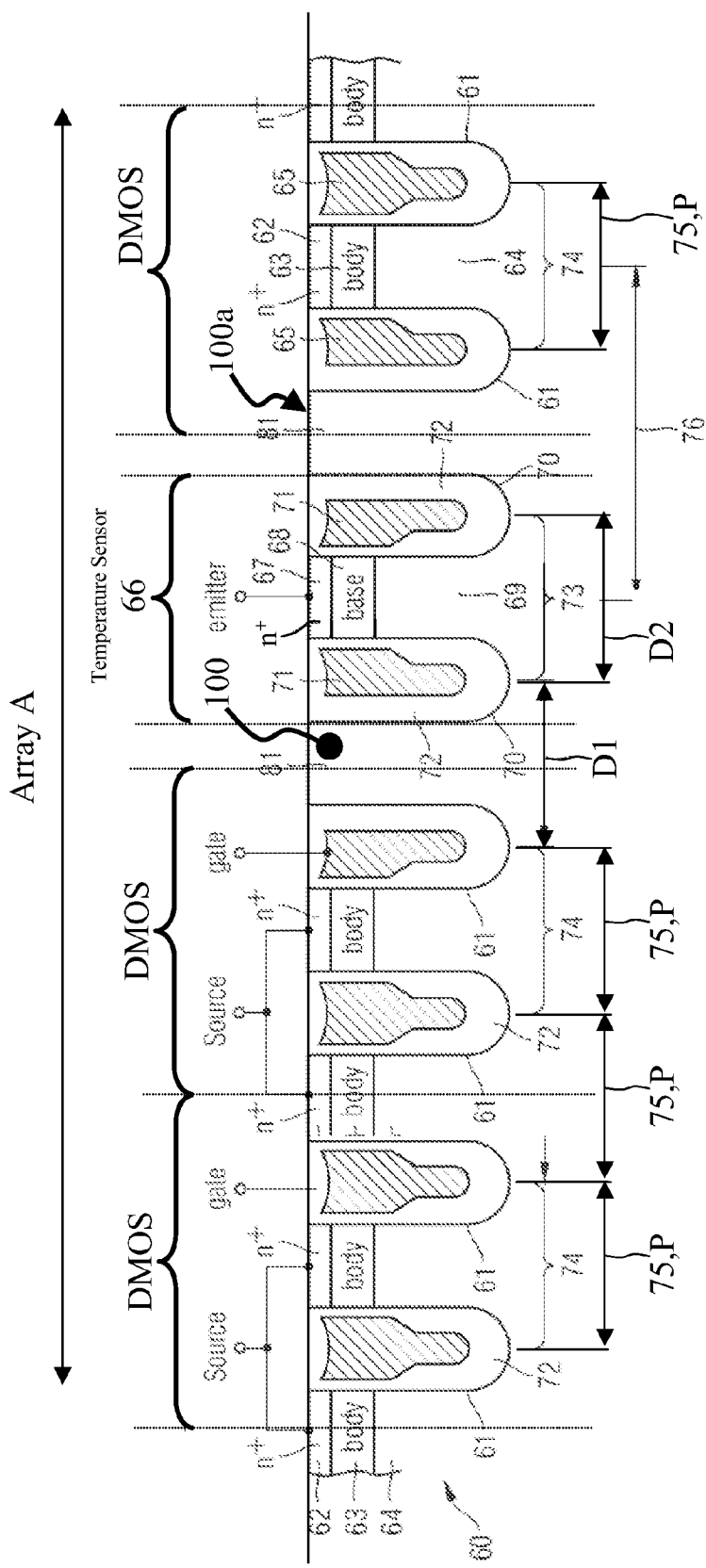
FIG. 16 illustrates a further embodiment of a transistor device according to the present invention.

The additional embodiment as illustrated in FIG. 16 illustrates a situation where all the indicated transistor cells 74 form a common transistor array A. Therefore, the temperature sensor 66 as illustrated in FIG. 16 is integrated into the cell array A of transistor cells 74. Again, the distance D1 of the temperature sensor 66 within the cell array A when compared to the closest active transistor cell 74 of the array A has approximately the same value as the pitch 75 underlying the array A of transistor cells 74.

In the embodiments as illustrated in FIGS. 1, 15, and 16, the temperature sensor 66 is formed in a region or portion of the surface 100a or in a portion below the surface 100a of the underlying silicon substrate 100 in which the cell array A of the transistor device is formed. This enables the detection of the temperature more accurately as the location of measurement is closer to the location where the heat is produced. In addition, procedural burden when manufacturing the underlying structure is reduced. Further, no additional surface topology is introduced.

Figure 2:
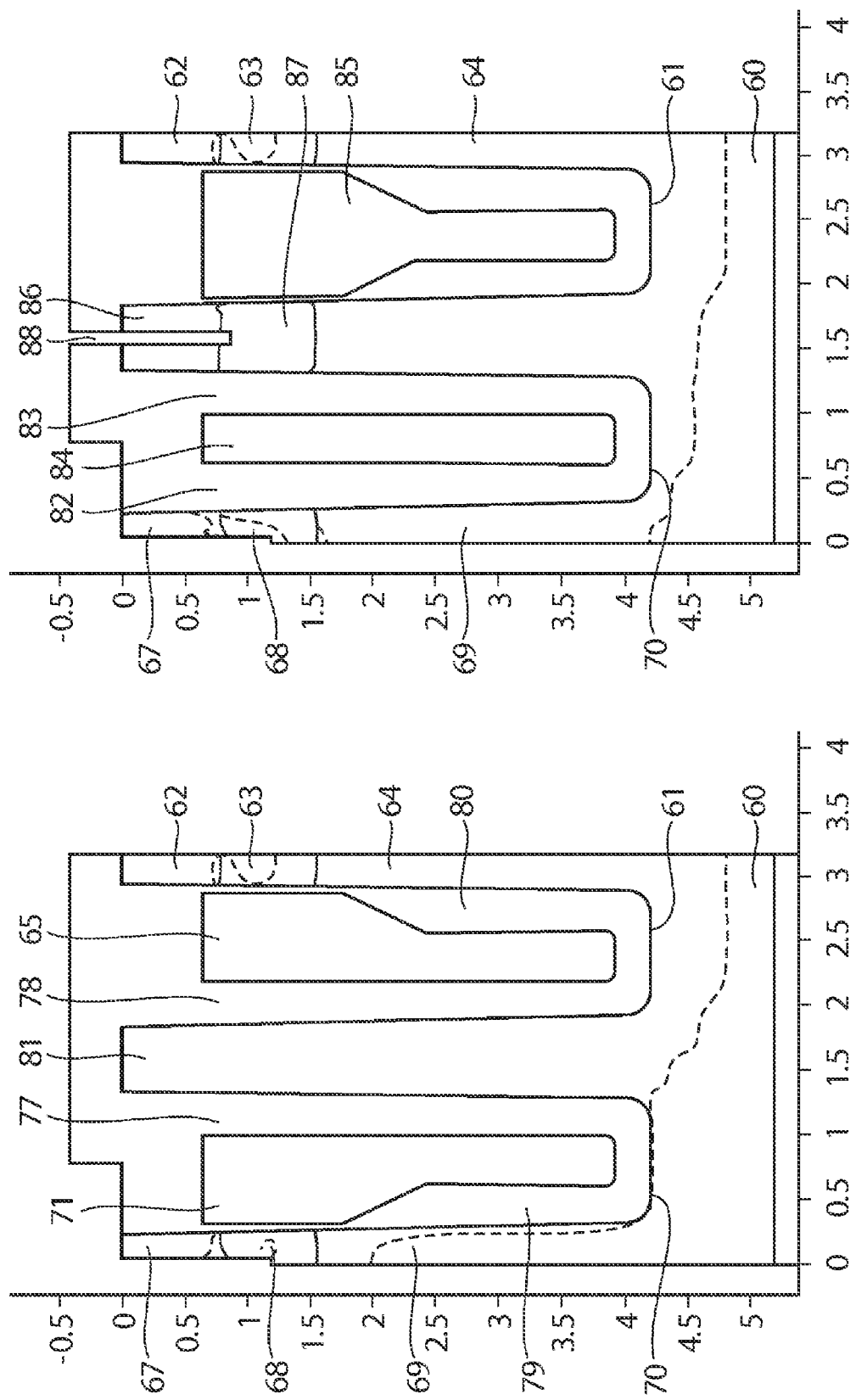
FIG. 2 illustrates refinements of a junction area between a temperature sensor and cell array in a transistor according to one embodiment of the invention.

The left-hand part of FIG. 2 illustrates an enlarged view of the detail identified by the reference number 76 in FIG. 1. This detail illustrates two isolation layers which follow one another in the horizontal direction, specifically the isolation layer 77 as well as the isolation layer 78, thickened over the entire vertical extent of the corresponding trenches 70, 61. In contrast to this, one isolation layer 79 as well as an isolation layer 80 are only partially thickened, but are thinned in the upper area of the corresponding trench. A mesa region 81 which is formed between the isolation trench 70 and the cell array trench 61 is deactivated, that is to say no source regions or body regions are provided within the mesa region 81.

The right-hand part of FIG. 2 illustrates an alternative embodiment of a junction area between the temperature sensor 66 and the first active cell 74 in the cell array. In this embodiment, two isolation layers which follow one another in the horizontal direction, namely the isolation layers 82 and 83 are likewise thickened over the entire vertical extent of the isolation trench 70. The difference from the previous embodiment is that, in this case, both thickened isolation layers are provided within the isolation trench 70 while, in contrast, in the previous embodiment, one thickened isolation layer is provided within the isolation trench 70, and the other thickened isolation layer is provided within the cell array trench 61. The different configuration of the isolation layers is also due to a different electrode shape: for example, an axially symmetric electrode shape is chosen in the first embodiment, while a combination of an electrode 84 with a homogenous thickness as well as an electrode 85 which is partially thickened is chosen in the second embodiment.

A further difference is that the mesa region 81 is activated in the second embodiment, that is, doped regions 86, 87, with which electrical contact is made by means of a contact 88, are provided within the mesa region 81. The width of the mesa region 81 varies depending on the requirement, in order to obtain the desired potential line profile. It has been found that two thickened isolation layers (in particular field oxide layers) that follow one another and the use of two partially thinned isolation layers (in particular gate oxide layers) in conjunction result in advantageous potential line profiles. Thinned isolation layers have better thermal conduction between the cell array and the temperature sensor, thus allowing a largely uncorrupted temperature measurement. However, in this case the field peaks easily occur in the vicinity of the thinned areas of the isolation layer. This can be compensated for again by the use of thickened isolation layers. Thus, overall and as described above, a combination of two thickened isolation layers and two partially thinned isolation layers with corresponding electrodes is advantageous.

Figure 3:
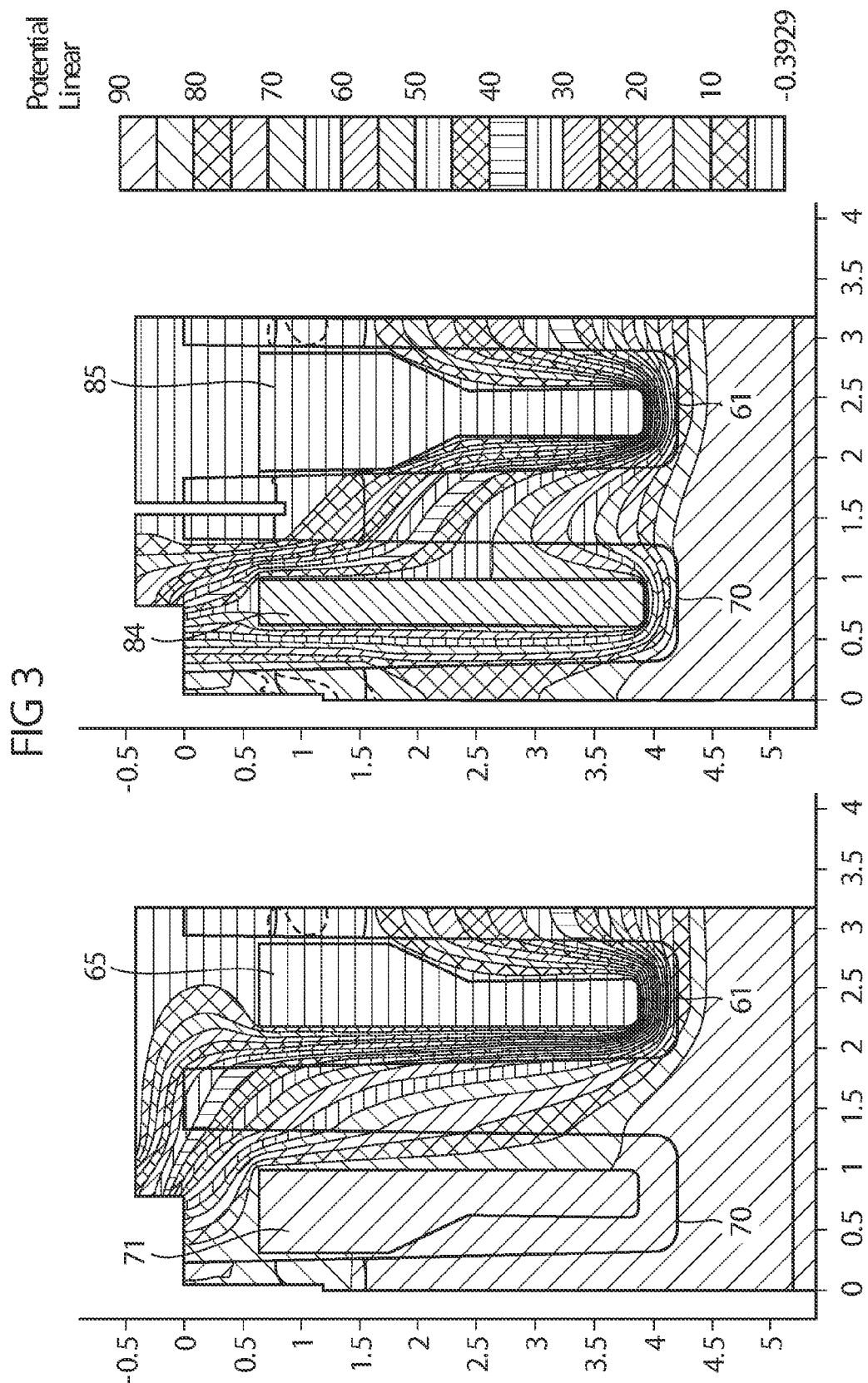
FIG. 3 illustrates potential profiles for the embodiments in FIG. 2.
Figure 4:
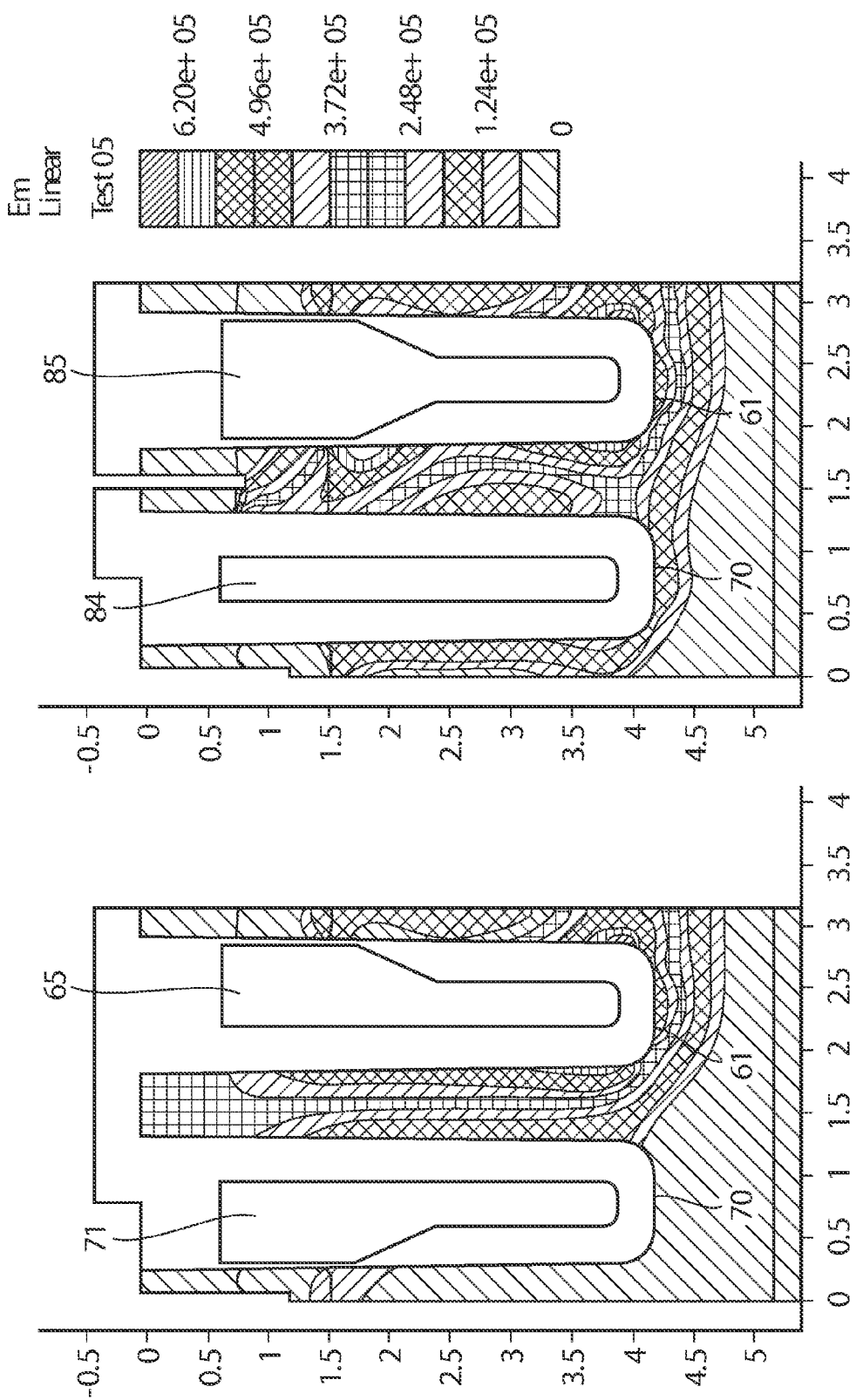
FIG. 4 illustrates electrical field profiles for the embodiments in FIG. 2.

Potential profiles and profiles of the electrical field for the embodiments in FIG. 2 are respectively simulated in FIGS. 3 and 4. In this case, the potential on the electrodes 65 and 85 within the cell array trench 61 was set to 0V. The potential of the (not shown) drain connection was set to 90 V. In the first embodiment as illustrated in FIG. 2, the isolation trench and the temperature sensor were at the potential (drain connection potential −5 V), as is normally the case for a temperature sensor which is connected to the drain connection via a zener diode. In the second embodiment, as illustrated in FIG. 2, the temperature sensor was at the potential (drain connection potential −5 V), and the electrode 84 in the isolation trench 70 was at half the potential of the drain connection potential.

The profiles of the electrical field which result from the potential line profiles illustrated in FIG. 3 are illustrated in FIG. 4. In both the first and the second embodiment, the maxima of the electrical field in each case occur at the base of the active cell array trench 61. The breakdown voltage is about 60 V.

As has already been mentioned, the isolation trenches 70 may be completely clad with thick oxide or with thin oxide, in which case it is also possible to provide one side of the isolation trench 70 with an isolation layer which is a combination of thick oxide and thin oxide, in which case the transition from the thick oxide to the thin oxide can in each case take place at any desired height along the trench side wall. The electrodes 71 and 84 in the isolation trench 70 are in one case composed of polysilicon, but in principle may also be formed from any other conductive material, and may in principle be at any desired potential. In the case of DMOS transistors, the potential of the electrodes 71, 84 is in one case set to a drain connection potential minus a zener voltage, or to half the drain connection potential, although it is also possible to set the potential to the gate potential or source potential. It is also possible to use two or more electrodes within one isolation trench, and to set them to different potentials.

According to one embodiment of the invention, individual potential relationships between the cell array of the trench transistor and the temperature sensor can be set as required by variation of the "isolation trench parameters" (variation of the shape of the isolation layers (oxide layers) and variation of the potentials of the electrodes within the isolation trench), thus making it possible to prevent premature breakdowns.

Figure 5:
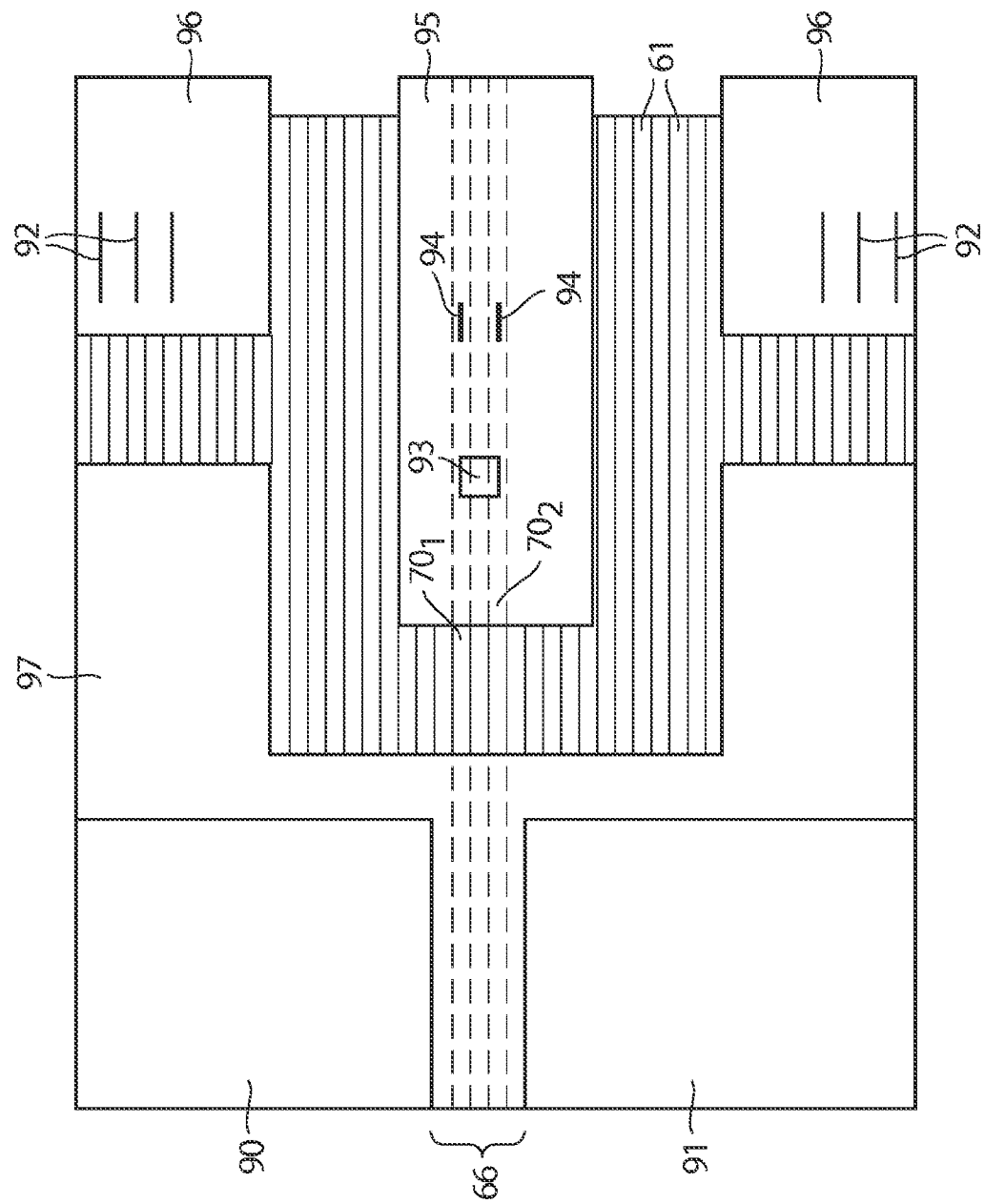
FIG. 5 illustrates a plan view of a part of one embodiment of the transistor according to the invention.
Figure 6:
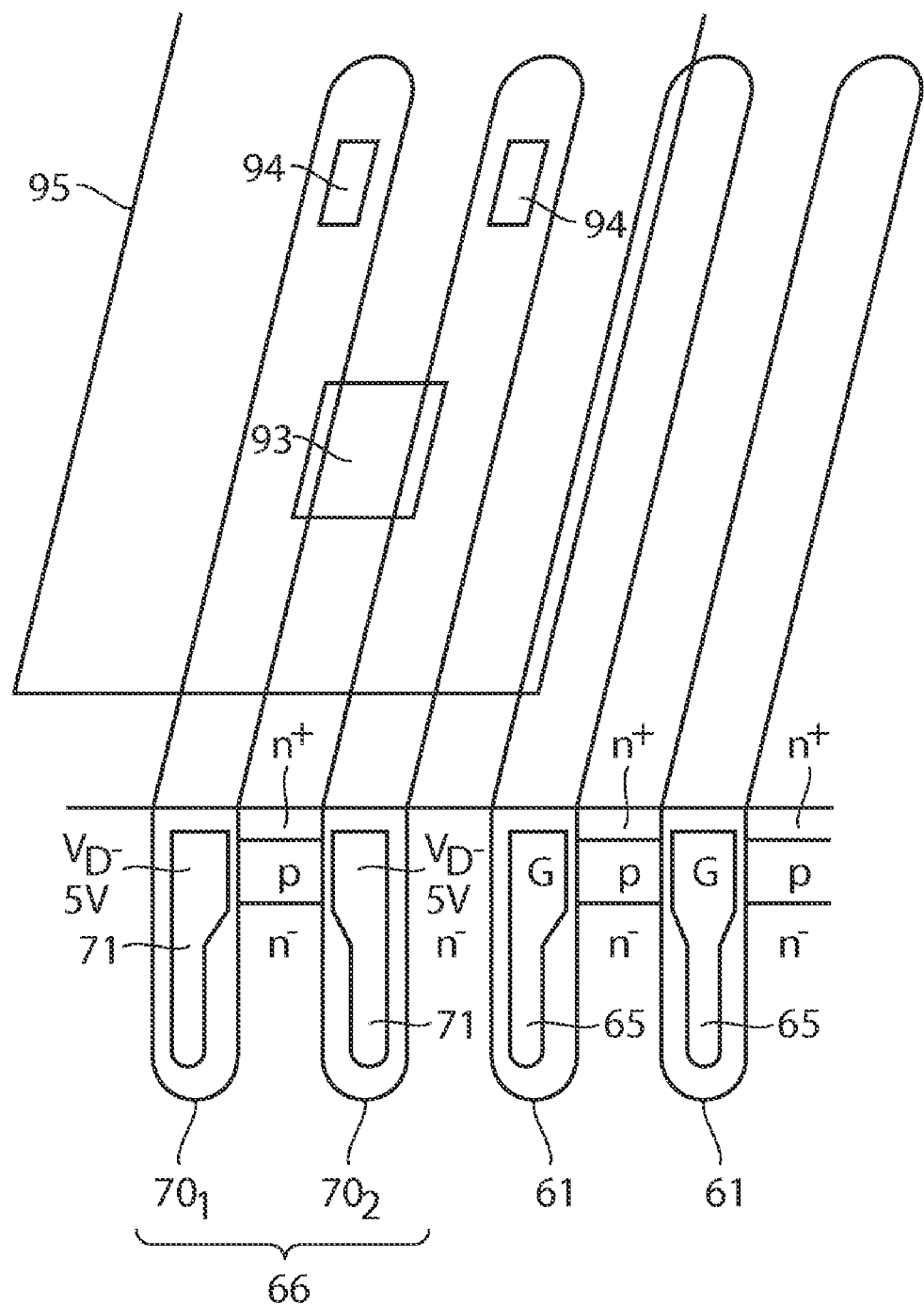
FIG. 6 illustrates a cross-section illustration of areas of the embodiment in FIG. 5.
Figure 7:
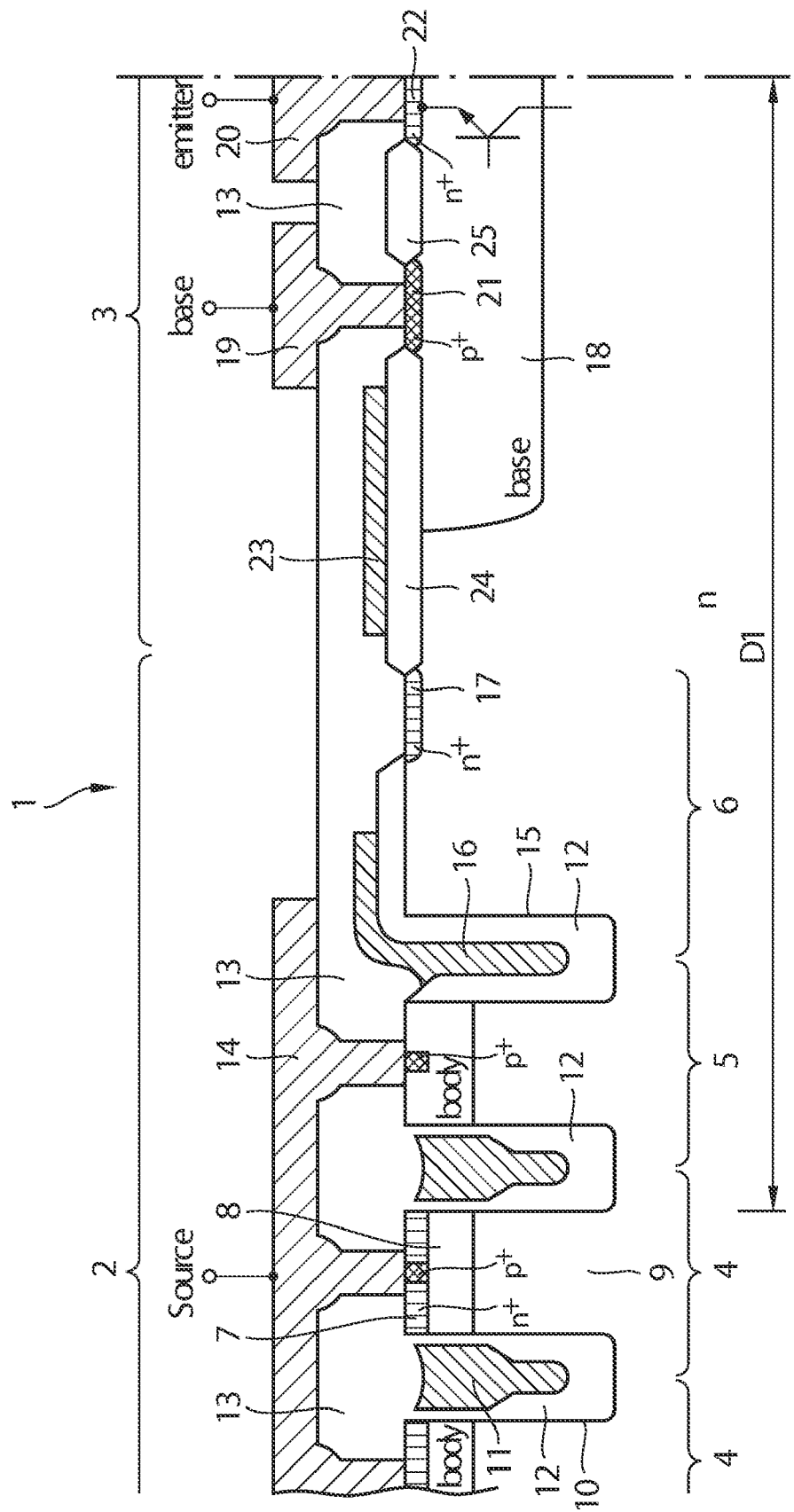
FIG. 7 illustrates a trench transistor with a temperature sensor according to the prior art.

One contact-making embodiment for the trench transistor according to the invention will be explained in more detail in the following text with reference to FIGS. 5 and 6. FIG. 5 illustrates a first cell array 90 and a second cell array 91, with two isolation trenches $70_1$ and $70_2$ being arranged between the cell arrays 90, 91, between which isolation trenches a transistor element is provided, in which case the combination of the isolation trenches $70_k$, $70_2$ and the transistor element located between them can be regarded as a temperature sensor 66.

Contact is made with the electrodes 65 in the cell array trenches 61 within the cell arrays 90, 91 through vias 92. Contact is made with the mesa region of the temperature sensor 66 through a via 93, and contact is made with the electrodes 71 within the isolation trenches $70_1$, $70_2$ through vias 94. The vias 93 and 94 make contact with a metallization area 95, and the vias 92 make contact with a metallization area 96. A cell array metallization area 97 is also provided.

It is advantageous for some active cells which are adjacent to the temperature sensor to have a higher ratio than the rest of the active cells: (channel width/channel length). An increased ratio such as this results in an increased current density and thus in an increased temperature in the vicinity of the temperature sensor, so that the temperature sensor evaluates the hottest area of the cell array.

Figure 8:
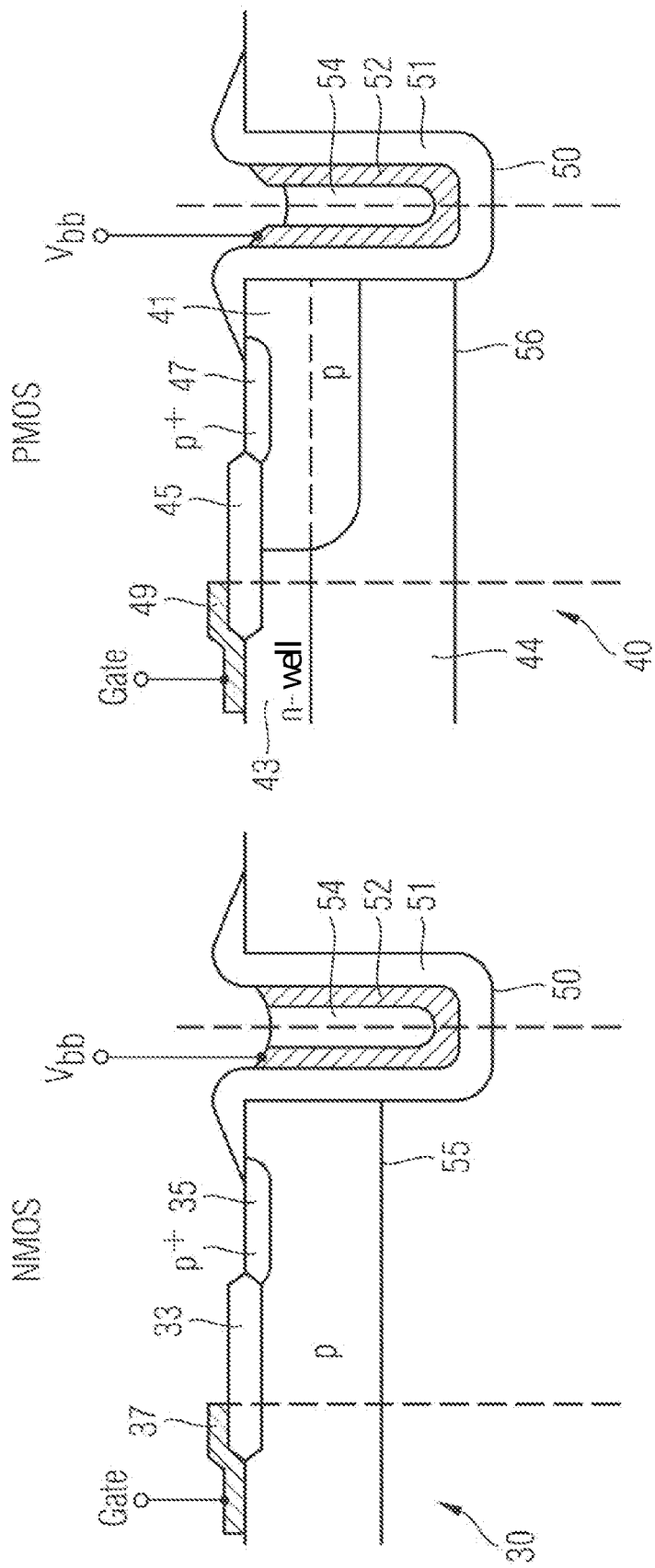
FIG. 8 illustrates a first and a second embodiment of a transistor component according to the invention.

FIG. 8 illustrates two embodiments of the transistor component according to the invention. The left-hand part of FIG. 8 illustrates a first embodiment of a transistor component which has at least two transistors arranged alongside one another (only the transistor located to the left of the isolation trench 50 is shown). The transistors are isolated from one another by an isolation trench 50, with the internal walls of the isolation trench 50 being clad with an isolation layer 51. An electrode 52 is also formed in the isolation trench 50, and is surrounded by the isolation layer 51. A layer 54 composed of filling material is provided within the electrode 52. The potential on the electrode 52 is at the substrate potential. If the NMOS transistor illustrated in FIG. 8 is compared with the NMOS transistor illustrated in FIG. 14, it can be seen that the dimensions of the isolation structure in FIG. 8 are considerably smaller. Furthermore, the p well 32 and the field plate 36 can be omitted, since their isolation function is now carried out by the isolation trench 50.

Analogously to this, the right-hand part of FIG. 8 illustrates a transistor component that contains at least two PMOS transistors, which are arranged alongside one another and are isolated from one another by an isolation trench 50. In this case, as in the left-hand part of FIG. 8, only one of the PMOS transistors (NMOS transistors) is illustrated. In this case as well, the lateral dimensions of the transistor component can be considerably reduced. Furthermore, there is no need for the p well 42. Likewise, the field plate 48 can be omitted. In this embodiment, the n well 43 should not be immediately adjacent to the isolation trench 50 since the trench electrode 52 which is at the potential Vbb would allow an n-channel to be formed to the substrate 40. This is prevented by a doped p region 41 (optionally also retrograde) adjacent to the isolation trench 50.

Figure 14:
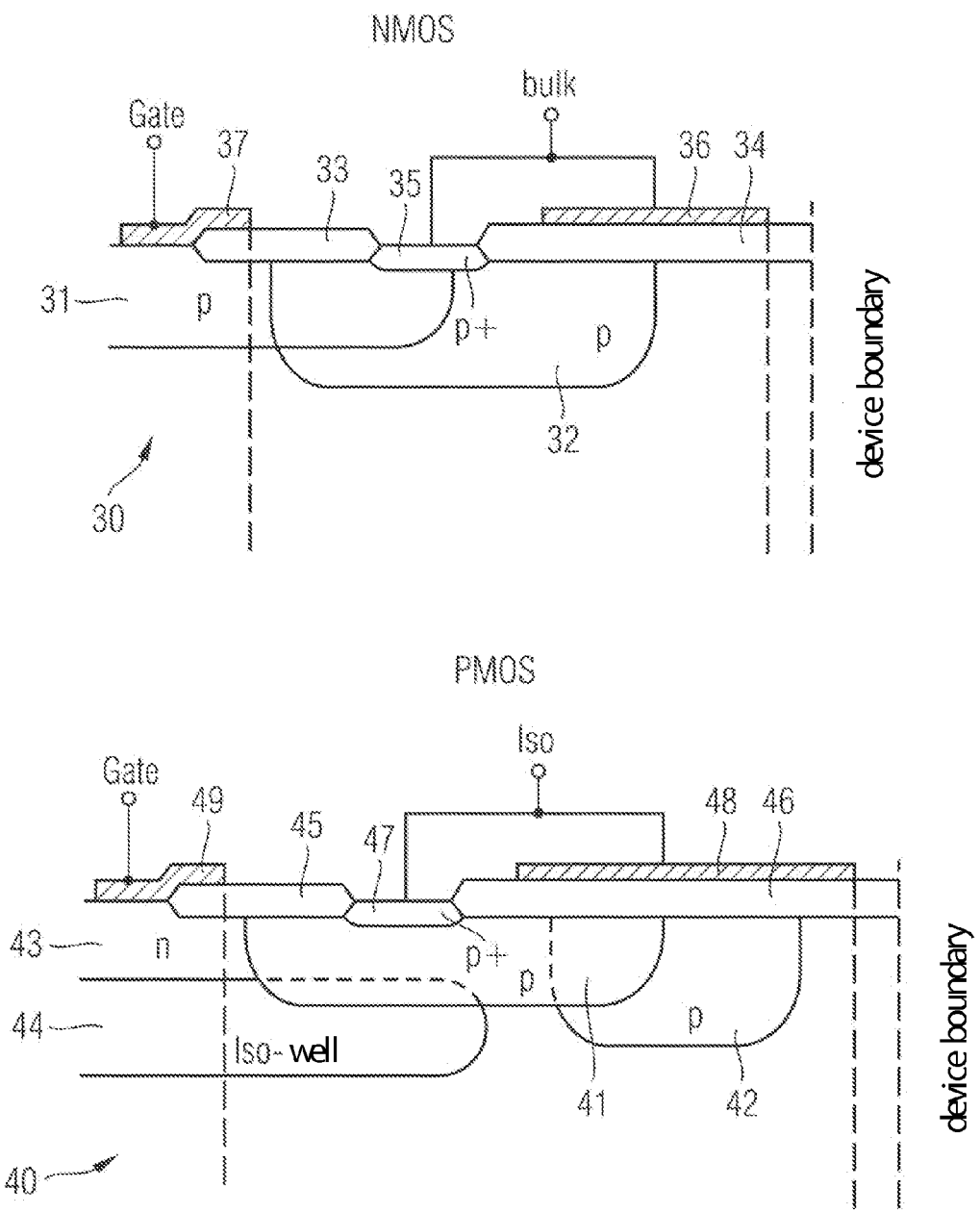
FIG. 14 illustrates transistor components according to the prior art.

Except for the differences which have been mentioned, the structures in FIG. 8 correspond to those in FIG. 14. The pn junction between the p well 31 and the substrate 30 is identified by the reference number 55, while the pn junction between the isolation well 44 and the substrate 40 is identified by the reference number 56.

FIGS. 9 to 12 each illustrate simulations for a transistor component which has two transistors that are isolated from one another by an isolation trench 50, with the left-hand part of the figures illustrating a transistor component with two NMOS transistors, and the right-hand part of the figures illustrating a transistor component with two PMOS transistors. The active transistor areas are not illustrated in the two figures. In the first case, the isolation trench provides isolation between two retrograde-doped p wells, and in the second case, isolation is formed between two isolation wells. The trench depths should be chosen such that the two transistors are just still isolated from one another.

Figure 9:
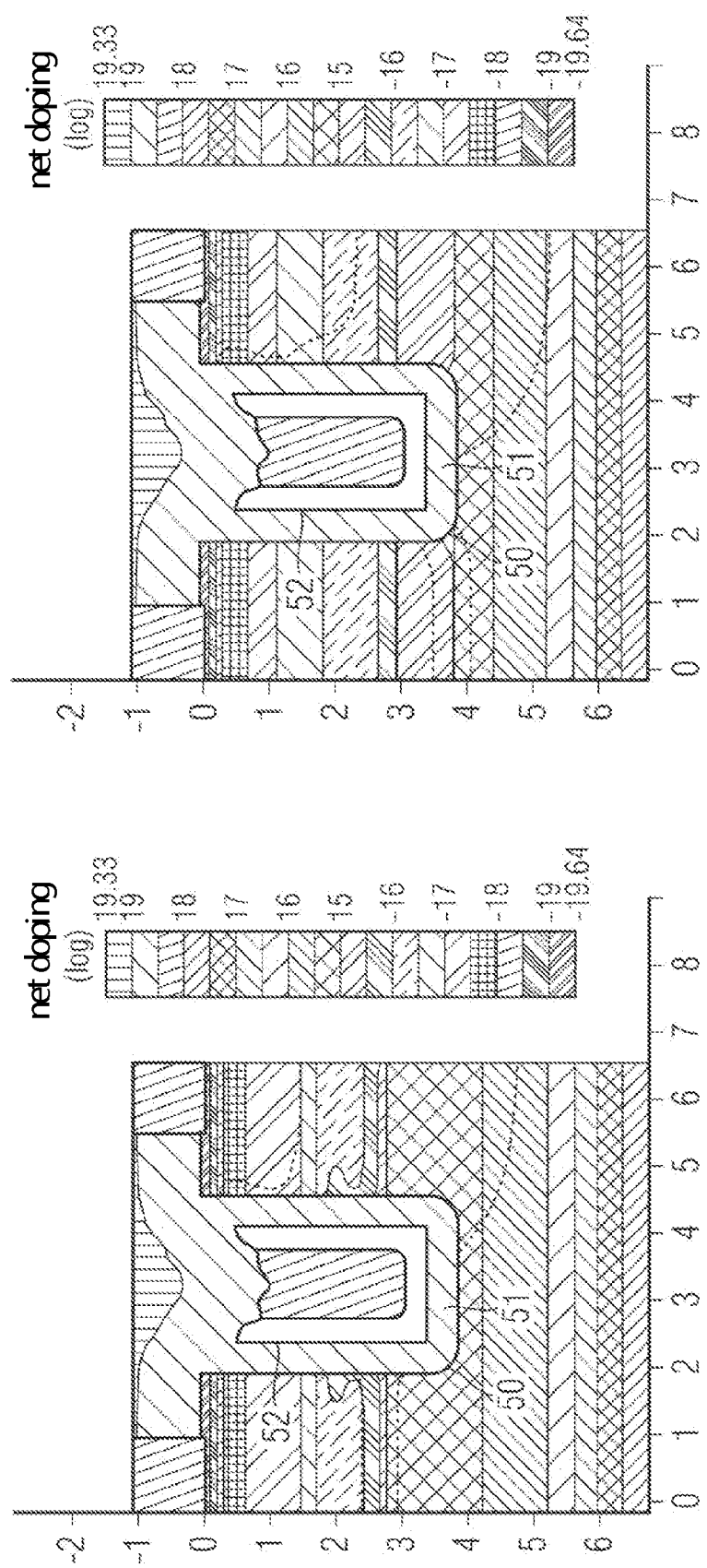
FIG. 9 illustrates doping concentrations for the embodiments in FIG. 8.

FIG. 9 illustrates the net doping concentrations on which the computer simulations are based.

Figure 10:
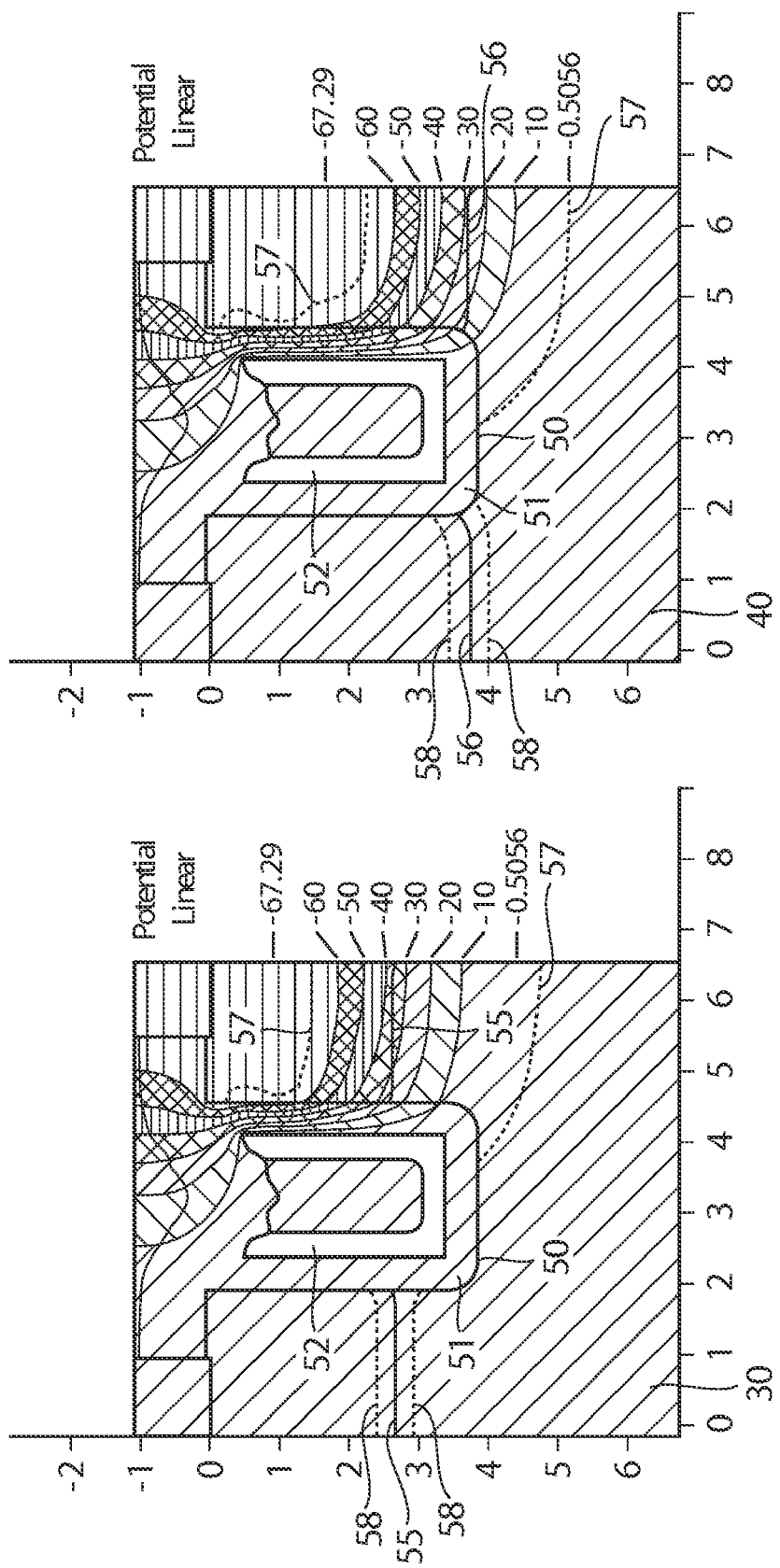
FIG. 10 illustrates potential profiles for the embodiments in FIG. 8.

FIG. 10 illustrates corresponding potential profiles for the breakdown situation. In contrast to actual operating conditions, the well (first transistor) which is adjacent to the isolation trench 50 on the left, the electrode 52 and the substrate 30, 40 were each at a potential of 0 V, and the well (second transistor) which is adjacent to the isolating trench 50 on the right is simulated in a negative form as far as breakdown. Both edge terminations achieve the required withstand voltage. As can be seen, the space charge zone extends only to a minor extent around the isolation trench 50 in the direction of the well, which is at the potential Vbb. It is thus possible to prevent punch-through of the electrical field between the wells (punches) just by the use of a standard trench such as this. Space charge zone boundaries are identified by the reference numbers 57 and 58.

Figure 11:
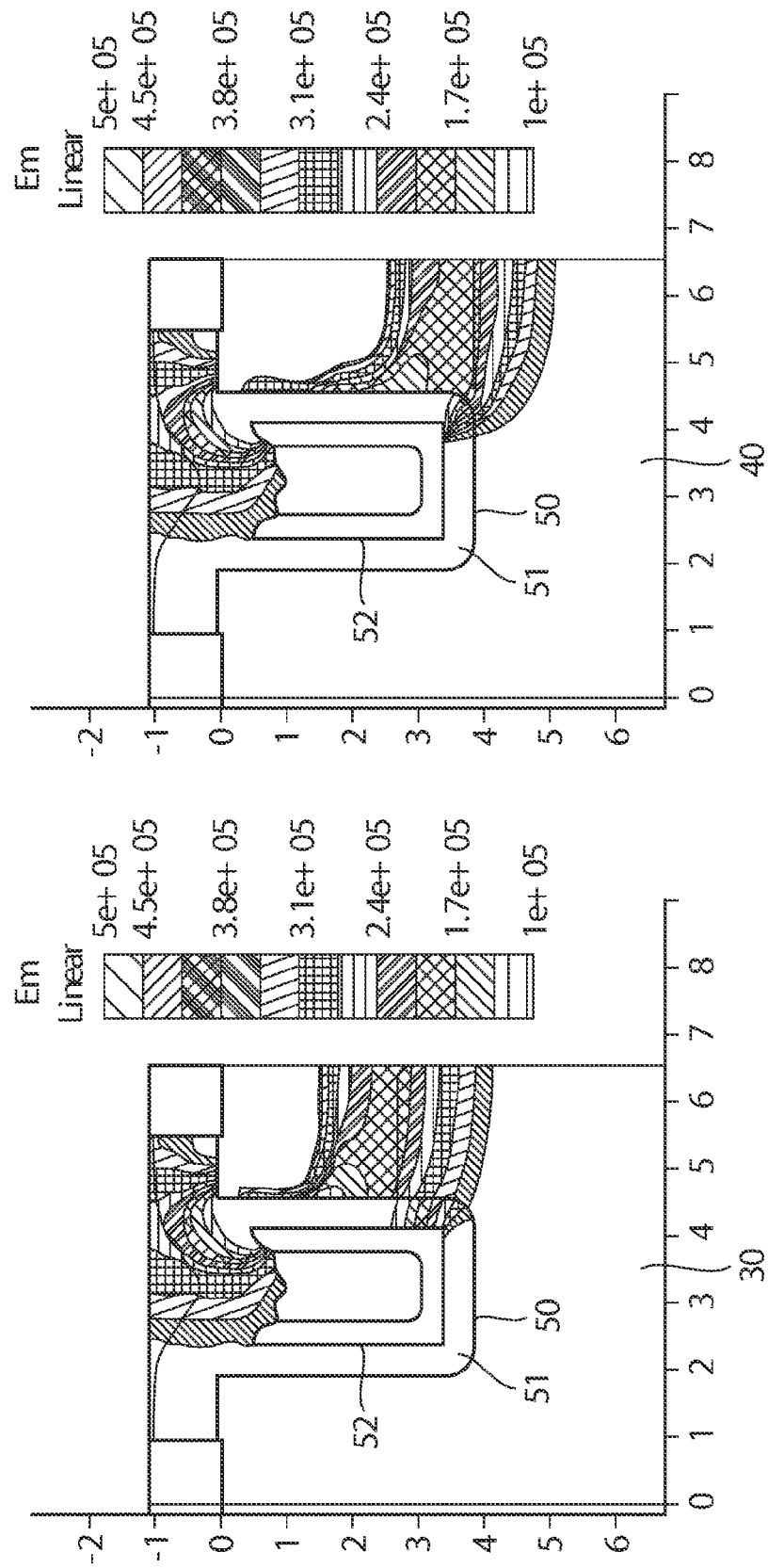
FIG. 11 illustrates profiles of electrical fields for the embodiments in FIG. 8.

As can be seen from FIG. 11, the maximum electrical field strength in both embodiments is achieved directly adjacent to the wall of the isolation trench 50. In this case, the field peak at the interfaces between the retrograde-doped well 31 and the isolation trench 50 is higher than that at the interfaces between the more lightly doped iso-well 44 and the isolation trench 50. The breakdowns do not take place homogenously over the bases of the well regions, but locally at the isolation trench 50. The maximum field strength achieved within the isolation layer 51 remains below 2 MV/cm (not shown in the diagram).

Figure 12:
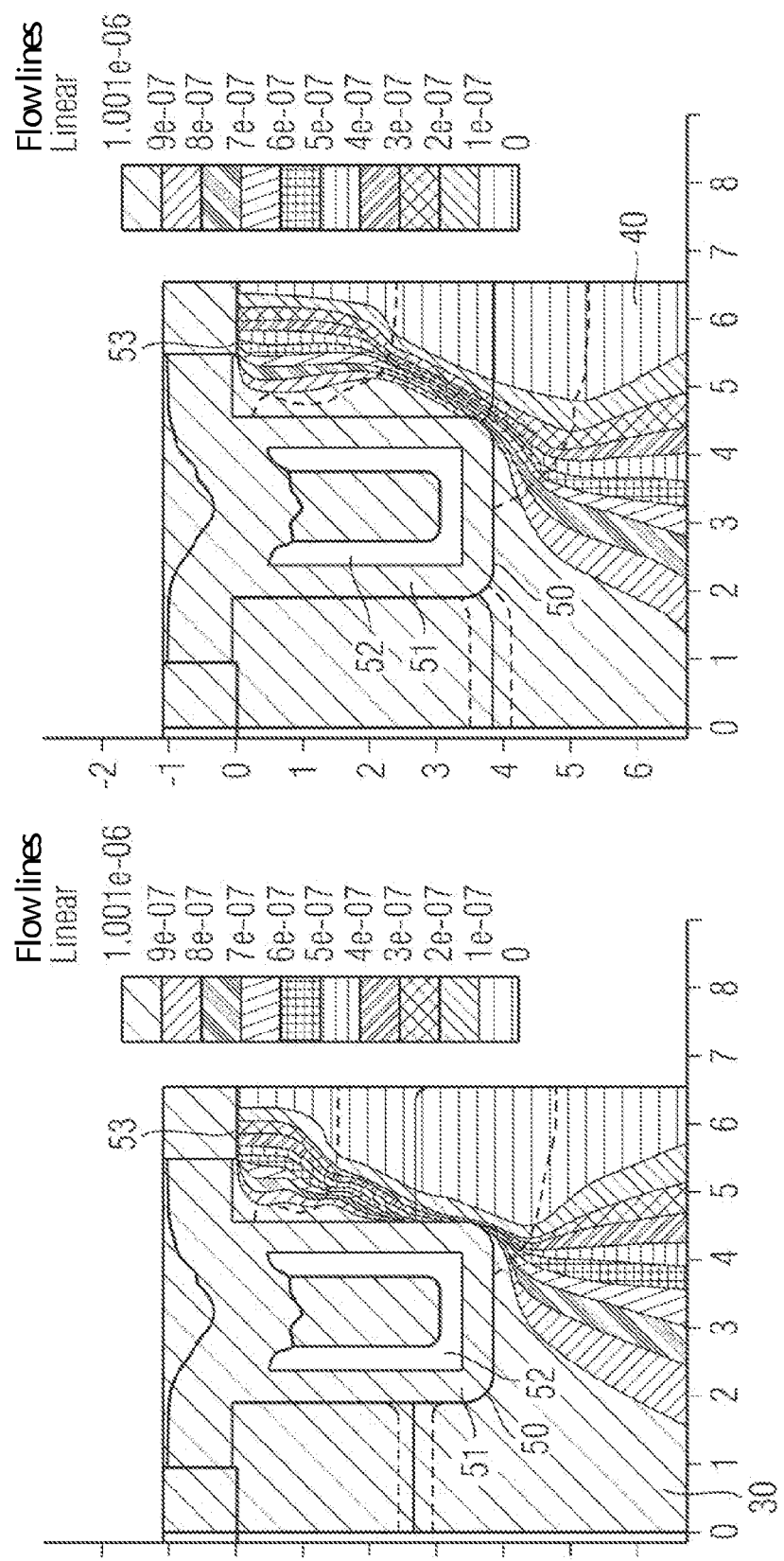
FIG. 12 illustrates flux line profiles for the embodiments in FIG. 8.

The illustration of the flux lines illustrated in FIG. 12 illustrates that the current in the breakdown case flows from the contact-substrate 53 ("well connection") interface along the side edge of the isolation trench 50 to the substrate 30, 40.

Figure 13:
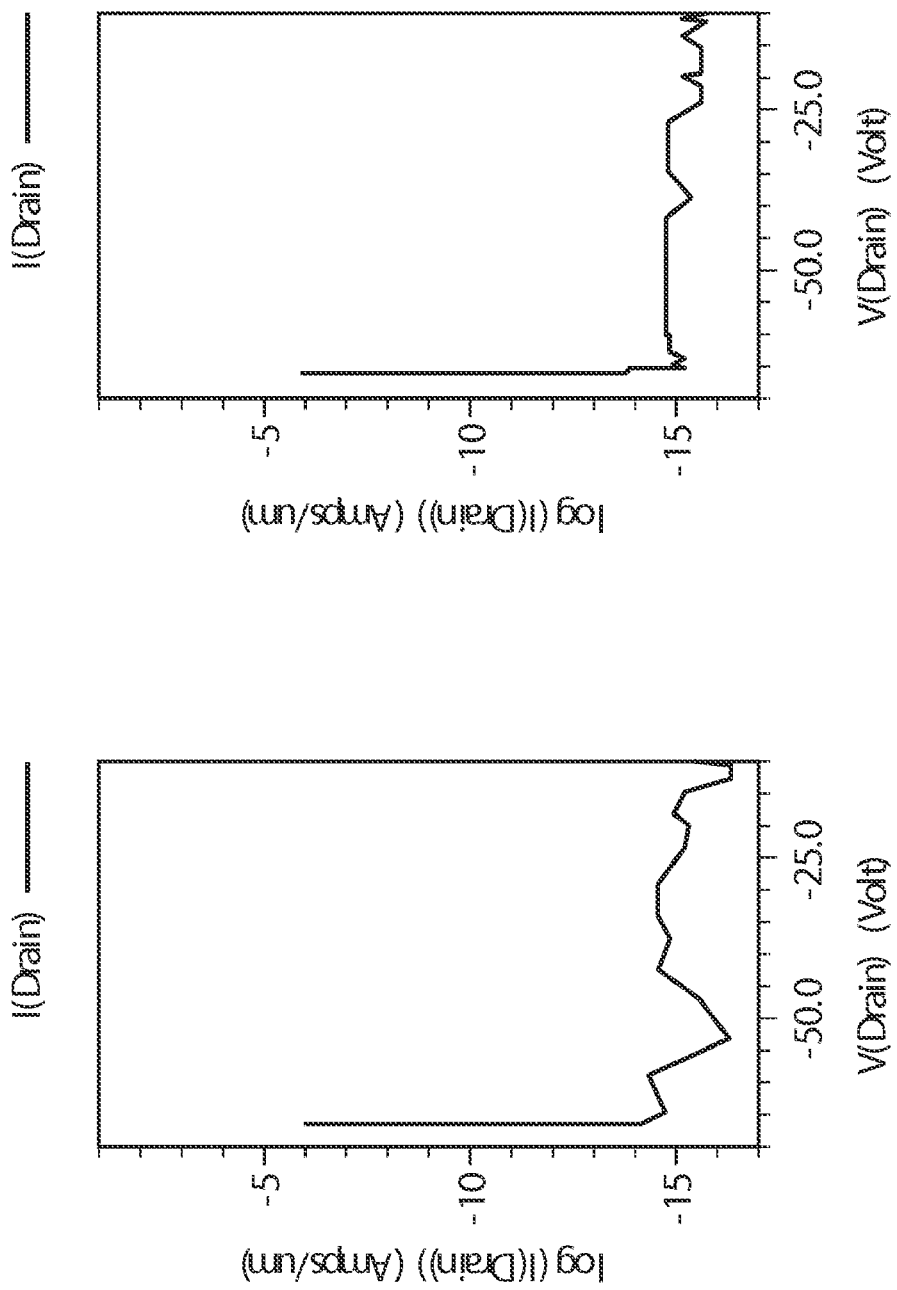
FIG. 13 illustrates drain current profiles for the embodiments in FIG. 8.

FIG. 13 illustrates the well current (the current which flows through the contact-substrate 53 interface) plotted against the voltage which is applied to this interface ("the well voltage"). As can be seen, no increased leakage current occurs before breakdown. The breakdown voltage for the transistor component with the NMOS (n-channel MOS (metal oxide semiconductor)) transistors is −66.8 V, and the breakdown voltage of the transistor component with the PMOS (p-channel MOS) transistors is −65.9 V. This is adequate for transistor components in the 60 V voltage class.

The isolation trench described above can be used for isolation and/or termination of any desired semiconductor components. The invention is accordingly not restricted just to isolation of n-channel and p-channel MOS transistors and, by way of example, it also covers the isolation of well regions of a bipolar transistor.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device comprising:
   a cell array formed in a silicon substrate having a surface with at least two active transistor cells, wherein trenches of the transistor cells are separated by a pitch;
   a temperature sensor proximate to the cell array and having an isolation structure configured to electrically isolate the temperature sensor from the cell array, the isolation structure having an isolation trench;
   wherein a distance between the temperature sensor and at least one of the active transistor cells that is closest to the temperature sensor corresponds approximately to the pitch between the trenches of the active transistor cells within the cell array; and
   wherein the temperature sensor is formed in a portion of or below the surface of the silicon substrate.

2. The transistor of claim 1, wherein the transistor is a trench transistor.

3. The transistor of claim 2, wherein internal walls of a cell array trench that is closest to the isolation trench, as well as internal walls of the isolation trench, are clad with isolation layers.

4. The transistor of claim 2, wherein at least two successive isolation layers in the horizontal direction are thickened over the entire vertical extent of the trench.

5. The transistor of claim 4, wherein the two successive thickened isolation layers are both formed within the isolation trench.

6. The transistor of claim 4, wherein one thickened isolation layer is in each case formed within the isolation trench and the closest cell array trench.

7. The transistor of claim 1, wherein a mesa region configured between the isolation trench and the closest cell array trench is alternatively activated and deactivated.

8. The transistor of claim 1, wherein the transistor cells are DMOS transistor cells.

9. The transistor of claim 1, wherein the temperature sensor is one selected from the group comprising a transistor, a diode, and a resistor.

10. The transistor of claim 3, wherein at least one electrode is provided in the isolation trench.

11. The transistor of claim 10, wherein the potential at the at least one electrode varies in the vertical and horizontal direction.

12. The transistor of claim 11, wherein possible potential values for the at least one electrode are one of the source potential, the gate potential, the drain potential/2, and the substrate potential/2.

13. The transistor of claim 1, wherein the temperature sensor is enclosed by two isolation trenches, wherein the distance between the two isolation trenches is less than the pitch between active transistor cells within the cell array.

14. A transistor device comprising:
a cell array formed in a silicon substrate having a surface and with at least two active transistor cells, wherein trenches of the transistor cells are separated by a pitch; and
a temperature sensor proximate to the cell array and comprising an isolation structure with two isolation trenches;
wherein the isolation structure is configured to electrically isolate the temperature sensor from the cell array;
wherein a distance between the temperature sensor and at least one of the active transistor cells that is closest to the temperature sensor corresponds approximately to the pitch between active transistor cells within the cell array;
wherein a distance between the two isolation trenches of the isolation structure is greater than the pitch between the trenches of the active transistor cells within the cell array; and
wherein the temperature sensor is formed in a portion of or below the surface of the silicon substrate.

15. A transistor component comprising:
a semiconductor body in which at least two transistors that are arranged parallel to one another are formed, wherein each transistor includes at least two trenches; and
isolation structures configured to electrically isolate the transistors from one another;
wherein the isolation structures each have an isolation trench other than the at least two trenches of each transistor; and
wherein a distance between at least one of the isolation trenches and one of the transistors corresponds approximately to a pitch between the trenches of the transistor.

16. The transistor component of claim 15, wherein the isolation trenches represent edge terminations of doped well regions that are formed in edge areas of the transistors.

17. The transistor component of claim 16, wherein the isolation trenches are provided at a distance from the well regions between doped well regions which are in each case formed in edge areas of the transistors.

18. The transistor component of claim 15, wherein the transistors are n-channel MOS transistors.

19. The transistor component of claim 15, wherein the transistors are p-channel MOS transistors.

20. The transistor component of claim 15, wherein an electrode is provided in the isolation trench.

21. The transistor component of claim 20, wherein the potential of the electrode is the substrate potential.

22. The transistor component of claim 15, wherein the transistor component is a trench transistor.

23. The transistor component of claim 22, wherein the isolation trench is produced together with the cell array trench, in one process step.

* * * * *